United States Patent
Han et al.

(10) Patent No.: US 12,081,168 B2
(45) Date of Patent: *Sep. 3, 2024

(54) ELECTRICAL PATHWAY INTERMITTENT FAULT DETECTION

(71) Applicant: Maxeon Solar Pte. Ltd., Singapore (SG)

(72) Inventors: Katherine Han, San Jose, CA (US); Jack Stewart, Forest Grove, OR (US); Hai-Yue Han, San Jose, CA (US)

(73) Assignee: MAXEON SOLAR PTE. LTD., Singapore (SG)

( * ) Notice: Subject to any disclaimer, the term of this patent is extended or adjusted under 35 U.S.C. 154(b) by 177 days.

This patent is subject to a terminal disclaimer.

(21) Appl. No.: 17/824,324

(22) Filed: May 25, 2022

(65) Prior Publication Data

US 2022/0286085 A1  Sep. 8, 2022

Related U.S. Application Data

(63) Continuation of application No. 17/064,057, filed on Oct. 6, 2020, now Pat. No. 11,349,433.

(Continued)

(51) Int. Cl.
*H02S 50/10* (2014.01)
*G01R 31/08* (2020.01)
(Continued)

(52) U.S. Cl.
CPC ............ *H02S 50/10* (2014.12); *G01R 31/086* (2013.01); *G01R 31/11* (2013.01); *H02S 40/34* (2014.12)

(58) Field of Classification Search
CPC .......... H02S 50/10; H02S 40/34; H02S 50/15; G01R 31/086; G01R 31/08; G01R 31/11;
(Continued)

(56) References Cited

U.S. PATENT DOCUMENTS

2010/0074515 A1   3/2010  Zhao
2012/0160297 A1*  6/2012  Yamakawa ....... H01L 31/02021
                                                         361/104
(Continued)

FOREIGN PATENT DOCUMENTS

CN    110380686 A  * 10/2019  ............ H02S 50/10
JP    2015188306 A * 10/2015
(Continued)

OTHER PUBLICATIONS

KR101549428B1 Solar Cell Module Monitoring Device and Method Thereof Abstract Translation.
(Continued)

*Primary Examiner* — Son T Le
(74) *Attorney, Agent, or Firm* — GRASSO PLLC

(57) ABSTRACT

Testing to detect intermittent electrical pathways is described. Applied currents may be reversed to fully test all components of a workpiece. Various testing methodologies may be employed. These methodologies may include Time Domain Reflectometry (TDR), mechanical agitation, dark current/voltage testing, (dark IV), i.e., electrical testing of a workpiece using applied electricity, and thermographic imaging, e.g., infra-red thermal imaging. The sensed voltage during agitation may be compared to a benchmark voltage to determine whether or not an intermittent failure exists.

18 Claims, 9 Drawing Sheets

Related U.S. Application Data

(60) Provisional application No. 62/949,808, filed on Dec. 18, 2019.

(51) Int. Cl.
    *G01R 31/11*     (2006.01)
    *H02S 40/34*     (2014.01)

(58) Field of Classification Search
    CPC .. G01R 31/28; G01R 31/2812; G01R 31/364; G01R 31/50
    See application file for complete search history.

(56) References Cited

U.S. PATENT DOCUMENTS

| | | |
|---|---|---|
| 2015/0101650 A1 | 4/2015 | Dhere et al. |
| 2015/0229269 A1 | 8/2015 | Rand |
| 2019/0140590 A1 | 5/2019 | Yura |

FOREIGN PATENT DOCUMENTS

| | | | |
|---|---|---|---|
| KR | 20130027889 A | * | 3/2013 |
| KR | 101549428 B1 | | 9/2015 |

OTHER PUBLICATIONS

PCT/US2020/06448, International Search Report, Apr. 21, 2021.
PCT/US2020/06448, Written Opinion, Apr. 21, 2021.
Abdulmawjood et al., Detection and Prediction of faults in photovoltaic arrays: A review, 2018 IEEE 12th International Conference on Compatibility, Power Electronics and Power Engineering, Apr. 10-12, 2018, pp. 1-9.
Ahmad et al., Detection of Typical Defects in Silicon Photovoltaic Modules and Application for Plants with Distributed MPPT Configuration, Energies, vol. 12 Issue 23, Nov. 29, 2019, pp. 1-27.
Haque et al., Fault Diagnosis of Photovoltaic Modules, Energy Science and Engineering, vol. 7 Issue 3, Jun. 2019, pp. 1-24.
Carter Ralph, Using Acoustic Emission to Detect Solder Joint Cracks, SMTA Huntsville, Mar. 24, 2016, pp. 1-49.
Testing Methods and Techniques: Testing Electrical and Electronic Devices, NASA, 1972, p. 5.

* cited by examiner

ELECTRICAL PATHWAY INTERMITTENT FAULT DETECTION

RELATED APPLICATION

This application is a continuation of U.S. patent application Ser. No. 17/064,057, which was filed on Oct. 6, 2020 and is entitled Electrical Pathway Intermittent Fault Detection, and is now U.S. Pat. No. 11,349,433, which issued on May 31, 2022. The '057 application claims the benefit of and priority to U.S. provisional application 62/949,808, which was filed Dec. 18, 2019 and is entitled Electrical Pathway Intermittent Fault Detection.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Numerous electrical pathways exist in a PV module. These pathways include: electrical components themselves—including their internal sub-components—leads emanating from electrical components; system traces; system busses; and connections therebetween. System, component, and sub-component connections may be soldered connections or connections without solder, such as snap-fit mechanical connections. When any of these pathways fail, the PV module operation and output may be hindered or completely lost depending upon the number and/or severity of the pathway failure. These failures may be permanent failures or intermittent failures. Intermittent pathway failures may be considered electrical pathways that are operational during periods of time and unintentionally inoperable during other periods of time.

DETAILED DESCRIPTION

Figure 1:
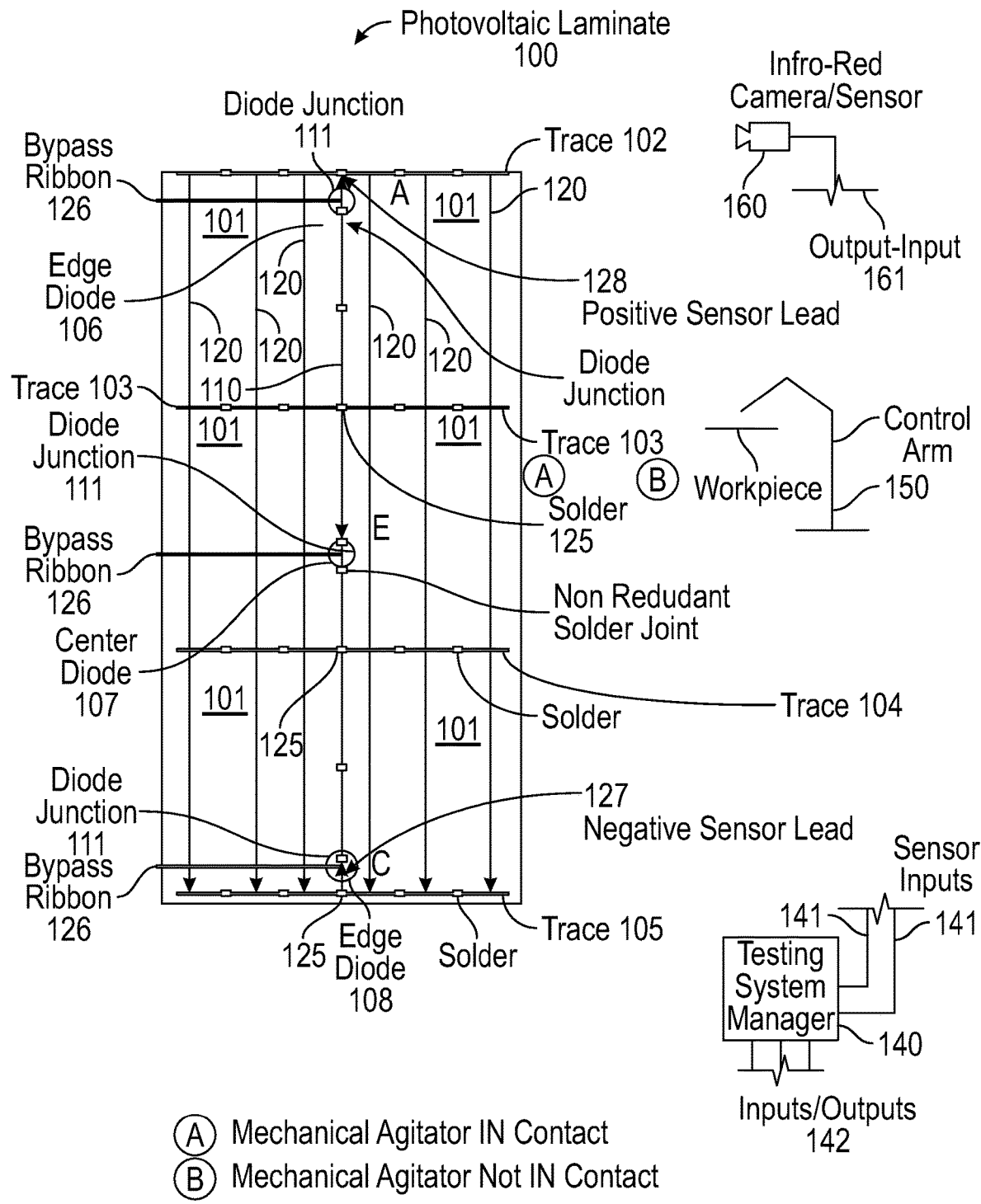
FIG. 1 illustrates a schematic of a laminate photovoltaic workpiece under forward bias testing according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112(f) for that unit/component.

"First," "Second," etc. As used herein, these terms are used as labels for nouns that they precede, and do not imply any type of ordering (e.g., spatial, temporal, logical, etc.). For example, reference to a "first" mechanical vibration test does not necessarily imply that this mechanical vibration test is the first test in a sequence; instead the term "first" is used to differentiate this mechanical vibration test from another mechanical vibration test (e.g., a "second" mechanical vibration test).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

This specification describes exemplary testing for intermittent electrical pathways followed by a more detailed explanation of various embodiments of testing methodologies as well as devices and systems that may be employed when testing. Various examples are provided throughout. These examples may be combined in part or in whole with other examples as well as with other features or processes not explicitly described herein but consistent with the teachings of the disclosure.

Embodiments may include an end of line electrical pathway testing system that uses a monitoring current with rapid voltage sensing frequencies to measure interconnections between photovoltaic cell circuits, laminated solar modules or other workpieces, for intermittent electrical pathways such as solder connections and diode functionality. Testing in embodiments may occur on partially assembled as well as fully assembled workpieces. In other words, electrical workpiece connections may be tested even though still more electrical connections remain to be added—a fully assembled workpiece, with each of its intended connections may also be tested. For example, a grouping of cells of a photovoltaic laminate may be tested before final assembly of the photovoltaic laminate as well as after final assembly of the photovoltaic laminate. The connections between photovoltaic cells, rather than connections within the cells themselves, are preferably targets for the intermittent testing of embodiments.

Various testing methodologies may be employed in embodiments. These methodologies may include Time Domain Reflectometry (TDR), mechanical agitation, dark current/voltage testing, (dark IV), i.e., electrical testing of a workpiece using applied electricity, and thermographic imaging, e.g., infra-red thermal imaging. These methodologies may be applied individually as well as in various combinations, and may be applied in various orders. These methodologies may be applied under forward bias electrical loading conditions of the workpiece as well as reverse-bias electrical loading conditions of the workpiece. Reversing the electrical loading on a workpiece from test to test or within testing methodologies may allow for testing or otherwise isolating electrical connections of a workpiece for testing not otherwise testable as well as for determining which, if any, electrical connections have failed. For example, a photovoltaic laminate with diodes may contain one-way electrical pathways that only become active under shaded conditions, these one-way pathways may not be activated in each testing condition and thereby testable unless current is applied in a forward bias during testing or a reverse bias during testing. Thus, testing in embodiments may first be conducted with current flowing in one direction and, tested again, with current reversed. For example, in certain PV circuits, laminates or modules being tested may be run both in reverse bias to measure diode function and solder joint condition in junction boxes. Then, a test may be run in the forward current bias direction to test for missing or broken solder connections on a center lane to bus ribbon joint, for example, as well as other electrical pathways.

As noted above, a testing system or process in embodiments may use Time Domain Reflectometry (TDR) to test electrical connections and to isolate the location of failed or passing electrical connections. In TDR embodiments, varying electrical signals may be placed on a workpiece and subsequently measured for the resulting reflected signals experienced after passing though or otherwise interfacing with one or more connections. The resulting signals are considered to result from the high damping effects introduced by passing by or through solar cells and other diodes. The resulting dampened, reflected signals may be measured and used to determine if any electrical connections in the workpiece have failed and which ones have failed. Processes in embodiments may measure electrical signals reflected back from a connection to be tested much like sending an acoustic signal underwater and listening for the reflected signal. Processes in embodiments may employ activated diodes, which have been turned on or otherwise biased with a power supply. In other words, during testing, diodes to be tested may receive an applied voltage or current from a power supply so as to amplify the reflected signal during TDR testing. Embodiments may also apply different electrical frequencies over a spectrum of frequencies when testing. This spread spectrum TDR testing may serve to promote testing accuracy by providing testing at numerous testing frequencies. This spread spectrum may, accordingly, provide to increase the ability to determine reflected signals as well as to test electrical connections that may provide indicia of failure at one testing frequency but not another frequency. Whether the reflected signal or downstream signal is collected, embodiments may employ these signals to determine whether a workpiece contains functioning or impaired electrical connections.

As also noted above, a testing system or process in embodiments may use a percussive agitation from a vibration generator to stimulate a change in electrical signal during the presence of an intermittent connection being tested for. Exemplary agitation tests may be performed with forward and reverse currents in order to test one-way electrical pathways in a workpiece being tested. As noted above, a photovoltaic laminate with diodes may contain one-way electrical pathways that only become active under shaded conditions, these one-way pathways may not be activated and thereby testable unless current is applied in a forward bias during testing or a reverse bias during testing. Thus, percussive agitation testing may first be conducted with current flowing in one direction and, tested again, or a third or fourth time, with current reversed.

As further noted above, a testing system or process in embodiments may employ dark current/voltage testing, (dark IV or non-illuminated IV). This dark IV applied electricity may, too, be applied in a forward bias as well as in a reverse bias of the workpiece. Accordingly, non-illumination applied current and voltage testing may be conducted with both forward bias current and reverse bias current. In each instance resistance changes, current changes, or other measurable electrical properties may be measured to determine electrical connection faults and failures. In these and other embodiments, open joints may be more readily determined by forward bias testing while reverse bias testing may be more suitable for determining intermittent or partially complete electrical connections. When testing PV modules, whether partially or fully assembled, hardware used for flash testing PV modules may also be employed to sense and measure resulting resistances from dark IV testing of embodiments.

As also noted above, a testing system or process in embodiments may employ infra-red imaging or other thermal imaging. Here, a current may be applied to a workpiece in forward and/or reverse bias while the workpiece is viewed using infra-red camera(s) or other thermographic sensors. The presence and/or absence or quantity of heat signatures may be used to identify faulty electrical connections. In some embodiments the current may be applied for fractions of a second as well as one, two, five, ten or more seconds. The applied current may be fractions of an amp as well as one, two, five, ten, $I_{max}$, or more amps. Thus, a fraction of max current of a workpiece or max current of a subsection of workpiece, as well as max current itself, and even a multiple of max current, may each be employed in embodiments when testing using infra-red sensors or other thermography sensors. Lock-in thermography techniques may be employed as well.

In thermal testing as well as other embodiments, when identifying module level electrical connections, for example, current may be sent in a forward bias direction for a period of time, e.g., five seconds, and then a reverse bias direction for a period of time, e.g., five seconds. An infra-red sensor or other thermography sensor may then read the infra-red or other thermal signatures of the electrical connections in the module workpiece and report on whether any connection is faulty and if so which ones. In some embodiments the electrical connections being tested may be within potting material, such as potting in a junction box.

Embodiments may be employed to identify intermittent connections or other faults in connections made during assembly of subcomponents of a workpiece. For example, internals of PV cells may not be tested in embodiments using thermography. Rather, j-boxes, connections of groupings of PV cells to a bus, etc., may be tested using the thermographic or other techniques taught herein. Thermographic testing, such as infra-red testing, may be employed to take advantage of low resistance shunts or other known connection properties. These low resistance areas can have higher currents, and corresponding higher thermal outputs. By using forward and reverse bias currents, more interconnections can be cordoned and tested with thermography or other techniques of embodiments.

In embodiments, a testing system manager as well as a human operator may observe the infra-red signatures, other thermal signatures, or other testing methodology outcomes (TDR, Dark IV, mechanical observation) and use them to determine operational status of one or more electrical connections in the workpiece. These observations may include thermal observations, resistance measurements, inductance measurements, in both real-time as well as from stored data. These observations may be compared to known benchmarks to determines if a junction being tested meets or does not meet an expected performance standard. For example, an expected temperature rating or an expected resistance or an expected impedance may be compared to one or more outputs from conducted testing.

As also noted above, measurements may be taken with and without percussive agitation or other testing methodology. Measurements taken without percussive agitation or other testing methodology may be taken to provide baseline or target voltage readings for properly operational workpieces. These target values may then be used for comparison purposes to determine whether a workpiece being tested meets these target values or shows an intermittent pathway of some kind using one or more of the testing techniques taught herein.

The measurement sampling of a workpiece when determining a target value, or for other testing purposes, may occur at frequencies higher than an agitation frequency or other testing frequency. The sampling is preferably higher than the frequency of testing in order to obtain multiple samples during a single agitation cycle, TDR electrical signal oscillation, or other testing cycle. Once the voltage or current is sampled, the sampling data may be used by a microprocessor to output a pass/fail indicator for the workpiece or certain components therein. The pass/fail indicator may be an audible tone as well as a visible indicator. Other pass/fail indicators may also be used.

The topology of the workpiece may be considered and used to determine the type of intermittent failure. For example, certain electrical pathways may be selectively used in PV modules. When only a reverse bias test provides a failure, the selectively used pathways may be indicated. If a diode or junction box is part of the selectively used pathway, reworking the connections therein may be employed to fix or otherwise salvage the workpiece.

System embodiments may include a power supply, a mobile agitation device, a thermographic sensor, and a voltage measurement system. These may be integrated into an end of line tester in a solar module factory to carry out intermittent connection and diode tests after flash testing and electro luminescence (EL) tests have completed. In use, a power supply may be applied in a reverse bias on the module or other workpiece, and a voltage may be measured. The power supply may also be employed for dark IV testing and TDR testing. The module or other workpiece may then be agitated using a haptic feedback device or other mechanical vibration source and the voltage may be measured again—sampled rapidly enough to identify any circuit opening conditions due to the vibration of the module. The measured voltage at certain intervals of time may then be compared to baseline values and pass/fail criteria may be applied. In certain photovoltaic cell circuit, laminate and/or module testing embodiments, a voltage of the module at ~100 mA in reverse may be approximately 2.5V. If this value is much lower or higher than 2.5V then a failure of diodes may be presumed and if the voltage changes significantly upon addition of the vibrating motion then it may be concluded that one of the j-box solder joints is intermittent. A forward bias of around 100 mA may also be applied in embodiments. The voltage may be measured and a vibration may be applied to the module (by touching the frame with a haptic feedback device or other vibration source). If the voltage changes significantly upon agitation a center lane to bus ribbon solder joint or another electrical pathway may be considered intermittent.

Embodiments may be calibrated to test various electrical pathways, including solder joints and mechanical connections. This testing may be performed on one or more PV laminates and/or PV modules, or other workpiece, which may be large and have circuits embedded between glass layers. When a failure is found, the indicator may specify a portion or component of the PV laminate in certain embodiments or may fail an entire PV laminate in other embodiments. Thus, embodiments may provide end of line module testing to identify intermittent connections and may also provide a diode screen that may screen 100% or about 100% or other portion of the diodes.

In embodiments, forward bias loading may be employed in the same direction as Electro Luminescence (EL) testing but with a smaller current. When testing with reverse bias loading, measurements may be taken before agitation as a benchmark, and after agitation to sense an intermittent connection. As noted above, the sensing should have a sampling rate that allows multiple samples to be taken during each agitation cycle or electrical cycle. In embodiments, the power source for the EL test may also be employed to power the mechanical agitation testing. The frequencies of agitation may range from tens of cycles per minute to thousands of cycles per second, or more or less. The voltages employed may range from micro volts to tens of volts or more or less.

In embodiments, the number of testing stations on a manufacturing line may be reduced when automatic soldering is used and testing may be conducted immediately after soldering is conducted. Embodiments may provide for testing PV laminates before or after potting is injected. Other components, such as frames and junction boxes may already be installed when testing is conducted.

As noted above, embodiments may employ rapid voltage sensing. This sensing may include use of a constant current applied to a workpiece and detecting voltages before and after agitation is mechanically applied. When agitation is directly applied, a voltage signal change occurs and should be sampled at a rate faster than the agitation frequency. For example, if agitation was applied at 19 Hz then sampling may be taken at 190 Hz or some other sampling rate larger than 19 Hz. A sampling rate of 10× the agitation frequency may be used as a starting point for measuring voltage or current fluctuation frequency waveforms although other multipliers, such as 2×, 3×, 4×, 5×, 6×, 15×, 20×, etc., may also be used.

Embodiments may employ a movable control arm such that an electrical pathway tester may be moved to touch the PV circuit, laminate module or other workpiece being tested. The movement of the control arm may be automated, semi-automated, and manually controlled. The electrical pathway tester may comprise an exposed direct contact vibration generator, a thermographic sensor, an infra-red sensor, a multiple frequency voltage generator, and/or other testing apparatus.

The sensors of embodiments may sense variations in voltage on the order of a few millivolts when a circuit is intact and an open circuit, e.g., 60 v, when a connection is intermittent. Sensed voltages, of tens or hundreds of millivolts, may also indicate an intermittent circuit. These millivolt or larger variations may be indicated visually, through a screen or readout, or audibly through a speaker. For example, a distorted audio signal can indicate an intermittent connection or otherwise failed workpiece.

As noted, processes may include testing with forward and reverse currents. The forward sweeps, i.e., testing with current in a first diode direction, may include measuring voltage to create a baseline. This baseline voltage may be an alternating voltage as well as a stable voltage. The workpiece being tested, e.g., a PV laminate, may then be agitated, dark IV tested, TDR tested, or otherwise tested, at an initial baseline. Measurements of the resulting voltage signal may then be taken at a frequency higher than a baseline testing frequency. This sampling may occur ten times or more in order to sample resulting voltages after agitation. When sufficient changes in voltage are detected, an intermittent connection may be considered to have been identified. The difference between the sampled voltages and the expected voltages may be on the order of 15%, 20%, 25%, etc. or more or less. This percentage detected difference may depend on the workpiece being tested, the test current being applied, and the frequency of the agitation, dark IV testing, TDR, and/or sampling.

As noted above, a reverse sweep may also be conducted. This reverse sweep may provide current flowing in the opposite direction, i.e., opposite the first diode direction. The testing may be conducted in the same fashion but may indicate that a different portion of the workpiece has an intermittent connection when a failure is detected. In other words, by changing the direction of current flow different portions of the workpiece, which may not be accessible under the first current flow due to diodes or other circuit topologies, may be tested in a reverse current situation. And, by conducting testing with both forward bias and reverse bias portions of the workpiece, e.g., the PV laminate, may be identified as failing. For example, junction box connections not accessible under a forward bias test may be identified with a reverse bias test. Likewise, a center bus solder joint problem can be confirmed using forward and reverse bias flows when the topology of a center bus provides for different current flows under the forward and reverse current bias flows.

Embodiments may provide an electrical pathway intermittent fault detection system comprising an electrical pathway tester having at least one of an exposed direct-contact vibration generator, a thermal sensor; or a multiple-frequency voltage generator; an exposed electrical sensor; an electrical power supply; and a microcontroller. The microcontroller may be configured, using outputs from the electrical pathway tester, to determine whether an intermittent electrical pathway is present in a potted junction-box of the photovoltaic laminate and to provide a signal when an intermittent electrical pathway is detected. In some embodiments the vibration generator may be configured to generate vibrations across a range of frequencies, and the power supply may be configured to provide electrical power to the vibration generator. In some embodiments, the microcontroller may be configured to consider the present frequency of vibration of the vibration generator when the vibration generator is in contact with a photovoltaic laminate, and further configured to consider voltages sampled from the photovoltaic laminate when the vibration generator is in contact with the photovoltaic laminate, the sampling rate of considered voltages being faster than the present frequency of vibration. In some embodiments, the microcontroller may be further configured to compare the voltages sampled with target voltages, to determine whether an intermittent electrical pathway is present in the photovoltaic laminate and to provide a signal when an intermittent electrical pathway is detected.

Embodiments may sometimes comprise a shared bus, the shared bus coupled to two or more of: the vibration generator, the voltage sensor, the power supply, and the microcontroller. In some embodiments, a preset frequency of vibration may be set to one-tenth or less of the frequency of the sampling rate of considered voltages and in some embodiments the target voltage is predetermined, calibrated for the photovoltaic laminate, and is in a range of 0.002 volts to 20 volts.

In some embodiments, the voltages sampled from the photovoltaic laminate result first from a forward bias current and from a reverse bias current, the current provided by the power supply, the forward bias current used to detect soldering failure in the photovoltaic laminate, the reverse bias current used to detect diode failure in the photovoltaic laminate. And, the signal, when an intermittent electrical pathway is detected, may be an audible frequency in the range of 20 Hz to 20,000 Hz. Still further, in some embodiments, the vibration generator may be mounted on an automated arm.

Some embodiments may comprise an electrical pathway intermittent fault detection device comprising a thermal imaging sensor; an electrical sensor; an electrical power supply; and a microcontroller. This microcontroller may be configured to apply a forward bias current through a potted electrical connection for a first period of time and to apply a reverse bias current through the potted electrical connection for a second period of time. The microcontroller, in embodiments, may also be configured to report information observed by the thermal imaging sensor during the first period of time and during the second period of time.

In some embodiments, the workpiece is a photovoltaic laminate and the potted electrical connection resides in a junction box. And in some embodiments, the thermal imaging sensor is an infra-red sensor. Still further, in some embodiments the electrical connection being tested has a maximum current and the forward bias current and the reverse bias current do not exceed the maximum current. The first period of time and the second period of time do not overlap in some embodiments and are each no longer than ten seconds in some embodiments. Sometimes, the first period of time occurs after the second period of time and sometimes, the first period of time occurs before the second period of time.

Embodiments may also include a process of electrical pathway intermittent fault detection comprising providing an exposed direct-contact vibration generator, a thermal sensor; or a multiple-frequency voltage generator; providing a plurality of electrical sensors; providing an electrical power supply; and providing a microcontroller. The microcontroller may be configured to determine whether an intermittent electrical pathway is present in a potted junction-box of a photovoltaic laminate and to provide at least an audible or visual signal when an intermittent electrical pathway is detected. In embodiments the vibration generator and the thermal sensor may be mounted on an automated arm. This automated arm may be configured to receive instructions from the microprocessor in some embodiments.

Embodiments may further comprise applying a forward current bias to the photovoltaic laminate and applying a reverse current bias to the photovoltaic laminate. In some embodiments, the forward current bias and the reverse current bias may be applied for the same duration of time but not applied during the same time period.

Figure 2:
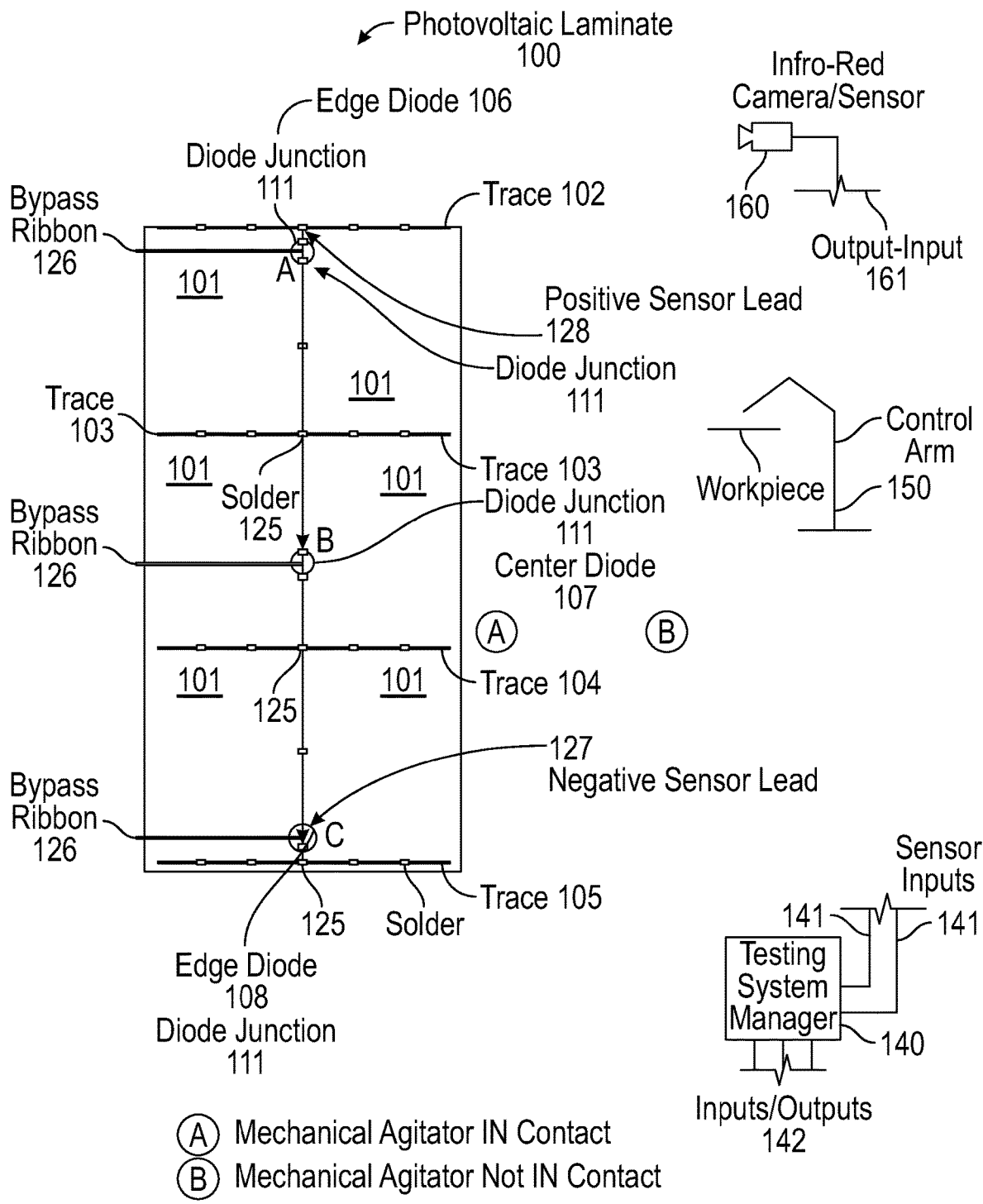
FIG. 2 illustrates a schematic of a laminate photovoltaic workpiece under reverse bias testing according to some embodiments.

FIGS. 1 and 2 show a photovoltaic laminate 100 workpiece as may be employed for testing in embodiments. Each workpiece has six hyper cells 101 in parallel to comprise the laminate 100. These hyper cells 101 are separated into three diode sections, the sections lay between trace 102 and 103, trace 103 and 104, and trace 104 and 105. These sections are electrically separated by diodes 106-108. These sections may be connected to junction boxes (which are not shown) and through junction boxes, to the center lane 110. Several non-redundant solder joints are associated with the center lane and the junction boxes electrically connected to the center lane. The diode junctions 111 can be areas of interest to be tested in embodiments. These junctions can include electrical connections made during assembly of the laminate 100, which have gone previously untested.

FIG. 1 illustrates a schematic of a laminate photovoltaic 100 workpiece under forward bias testing according to some embodiments. Thick lines 120 indicate electrical pathways for different types of tests. In the forward bias test of FIG. 1 current is passing through all of the cells and hitting the four joints of the module's four solder joints. There is no parallelization or redundancy if a joint is not functioning.

FIG. 2 illustrates a schematic of a laminate photovoltaic 100 workpiece under reverse bias testing according to some embodiments. The positions of a vibration generator are also shown. With position A indicating contact with the workpiece laminate and position B indicating a spacing between the workpiece laminate and the vibration generator. In the reverse bias test, which is shown in FIG. 2, the cells are avoided while the junctions are being tested for intermittent or otherwise faulty connections.

The positions A and B of a vibration generator are shown in FIGS. 1 and 2. Also labelled in these figures are diode junction 111, bypass ribbons 126, edge diode 106, solder joints 125, testing system manager 140, sensor inputs 141, inputs/outputs 142, control arm 150, thermal/infra-red camera/sensor 160, inputs/outputs 161, positive sensor lead 128, and negative sensor lead 127.

Position A in FIGS. 1 and 2 indicate contact with the workpiece laminate and position B indicates a spacing between the workpiece laminate and the vibration generator. The control arm 150 is shown schematically. The control arm 150 may be positioned to move one or more sensors of embodiments during testing protocols and may also serve to move or stow a testing system manager. The testing system manager 140 may be configured to control portions or all of the loading, sensing, and movement operations of embodiments and other features described or taught herein. The system manager may be configured in a single device or across multiple devices. The system manager may control applied currents to the laminate 100 or other workpiece and may receive outputs from cameras/sensors in embodiments. The manager may use these received outputs to identify any intermittent or complete faults in the laminate or other workpiece. These faults may be located at solder joints or other connections both within and outside of potted j-boxes.

Figure 9:
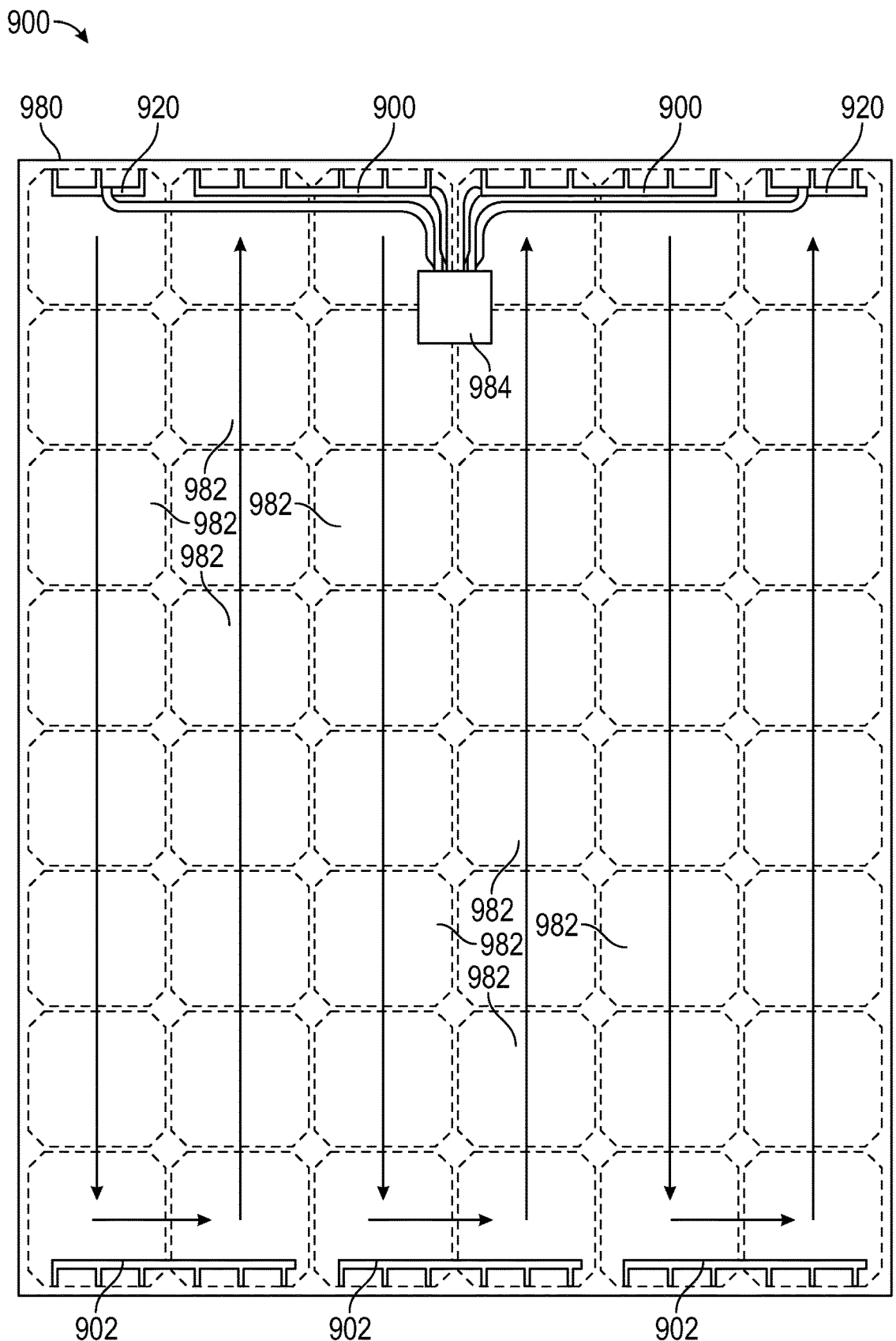
FIG. 9 illustrates a schematic of a laminate photovoltaic workpiece as may be employed in some embodiments.

As another example, FIG. 9 illustrates a schematic of a laminate photovoltaic 900 workpiece as may be employed in some embodiments. In particular, FIG. 9 shows the back side of the PV module 900 and includes an array (e.g., a 6×8 array) of PV cells 982. At one end of each column of cells 982, busbars 900 and 920 couple the columns of cells 982 to a junction box 984 coupled to the PV module 980. At the opposite end of each column of cells 982, formed cell connection pieces 902 couple pairs of columns together to connect two columns of cells in series connected string of cells. These series-connected strings of cells may be connected to junction box 984. These cell connection pieces or busbars 900 and 920, and/or diodes of junction box 984 can be areas of interest to be tested in embodiments. Connection pieces 902, which have parallel redundant connections may be skipped from testing or selectively tested in embodiments because the redundant connections can serve to deter specific testing of a single connection. For example, in some embodiments, single connection points are sought to be isolated for testing so that a test pass or failure can be attributed to a single connection. When a component has two or more connections that can't be individually isolated, these components may or may not be the target of embodiments depending on the level of specificity sought for the testing being conducted. Thus, if an entire component can be reconnected, for example, it may be tested even if each of the connections for the component can't be isolated for testing using the techniques taught herein.

Figure 3:
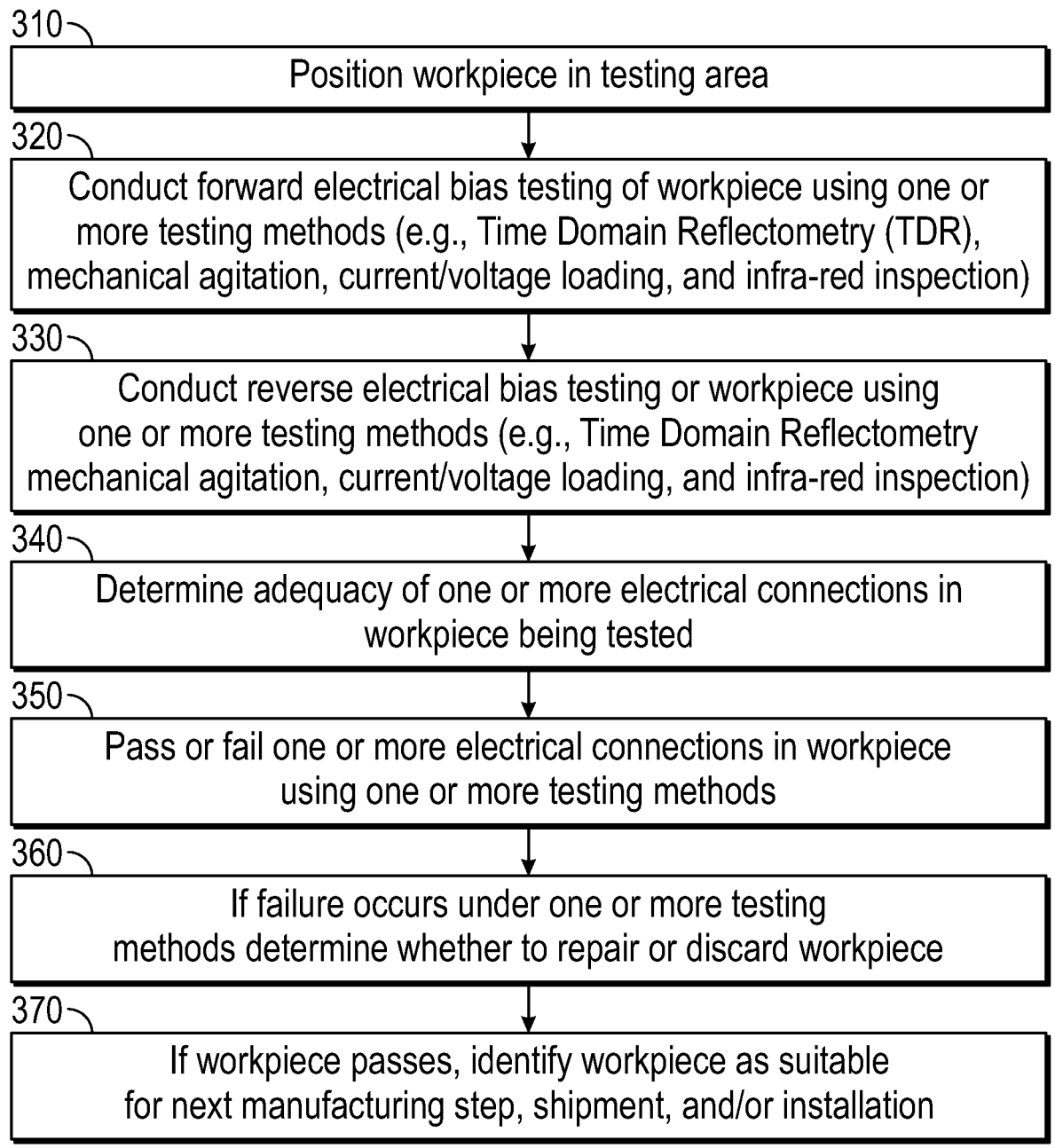
FIG. 3 illustrates process elements for workpiece testing as may be employed in some embodiments.

FIG. 3 illustrates workpiece testing process elements as may be employed in some embodiments. Label 310 provides that embodiments may include positioning a workpiece into a test area. This positioning may be completed manually or with automation, and may occur during manufacture, near the completion of manufacture as well as prior to installation. The workpiece may be a photovoltaic laminate with multiple soldered electrical connections or mechanical electrical connections as well as other devices with soldered electrical connections or mechanical electrical connections. Label 320 provides that embodiments may include conducting forward electrical current bias testing of a workpiece using one or more testing methods (e.g., Time Domain Reflectometry (TDR), mechanical agitation, current/voltage loading (dark IV), and thermal/infra-red inspection). These testing methods may be conducted in various sequences and in some embodiments only one or two or three of the methods may be used. The forward current bias may be provided and managed by a testing system manager. Likewise, the testing and analysis may be conducted by a testing system manager. Label 330 provides that embodiments may include conducting reverse electrical bias testing using one or more testing methods (e.g., Time Domain Reflectometry, mechanical agitation, current/voltage loading, and infra-red inspection). Like 320, the reverse electrical bias testing may be conducted by the testing system manager using one or more of the testing methods. Label 340 provides that embodiments may include determining the adequacy of one or more electrical connections in workpiece being tested and label 350 indicates that these determinations can lead to passing or failing one or more electrical connections in workpiece using one or more of the testing methods. As shown at 360, if failure occurs under one or more testing methods, the testing system manager may make a recommendation or a determination as to whether or not to repair or discard the workpiece. As shown at 370, if a workpiece passes, the workpiece may be identified as suitable for a next manufacturing step, shipment, and/or installation.

Figure 4:
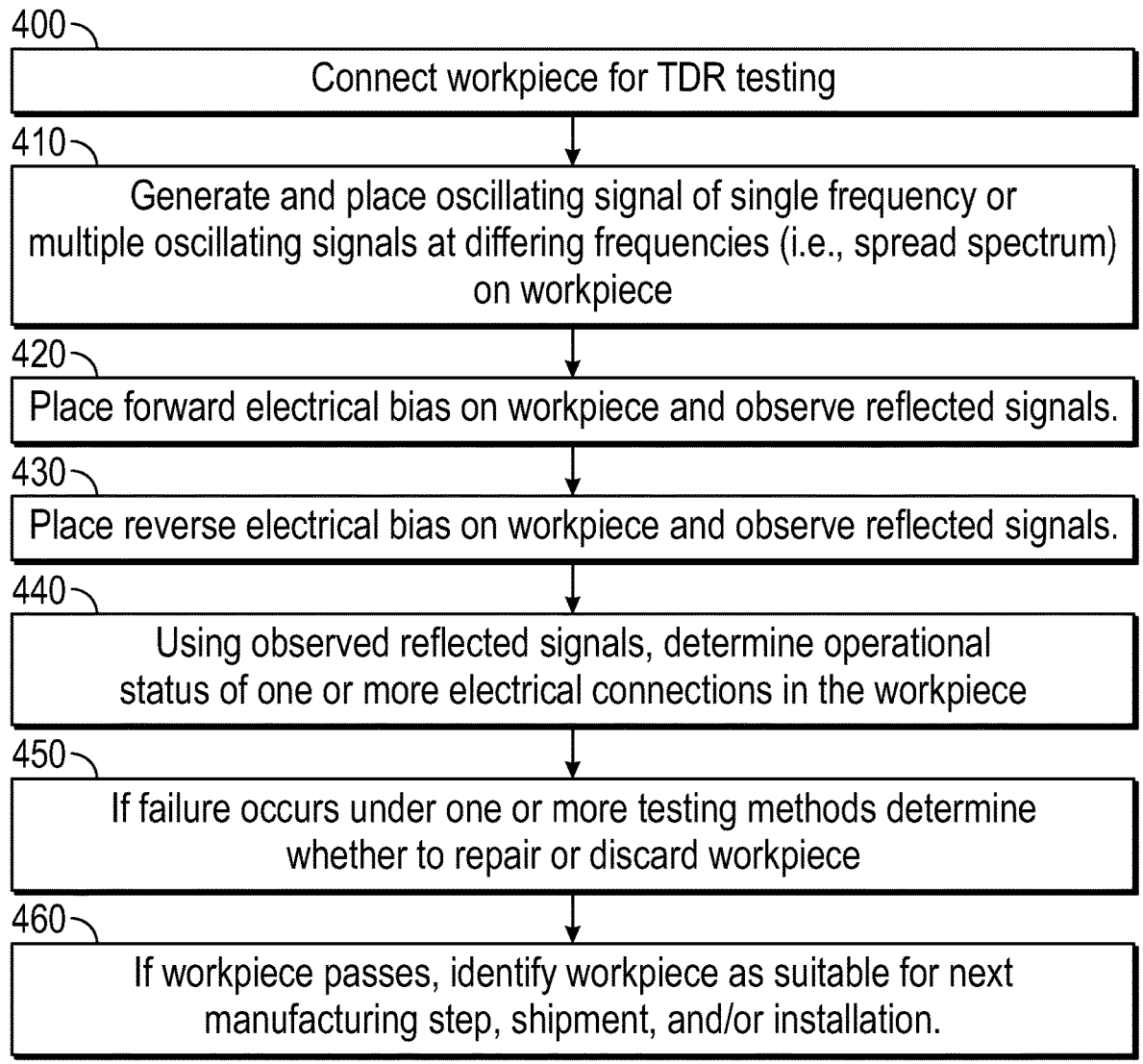
FIG. 4 illustrates process elements for time domain reflectometry (TDR) workpiece testing as may be employed in some embodiments.

FIG. 4 illustrates process elements for time domain reflectometry (TDR) workpiece testing as may be employed in some embodiments. As shown at 400 embodiments may begin by connecting a workpiece for TDR testing. Afterwards, as shown at 410, one or more oscillating signals of a single frequency or multiple oscillating signals at differing frequencies (i.e. spread spectrum) may be generated and placed on the workpiece. As shown at 420/430 embodiments may also include placing forward electrical bias on the workpiece and observing reflected signals as well as placing reverse electrical bias on the workpiece and observing reflected signals. As shown at 440, observed reflected signals, may be used to determine operational status of one or more electrical connections in the workpiece and if failure occurs, under one or more testing methods determine whether to repair or discard workpiece, as shown at 450. Comparatively, as shown at 460, if the workpiece passes, the workpiece may be identified as suitable for a next manufacturing step, shipment, and/or installation.

Figure 5:
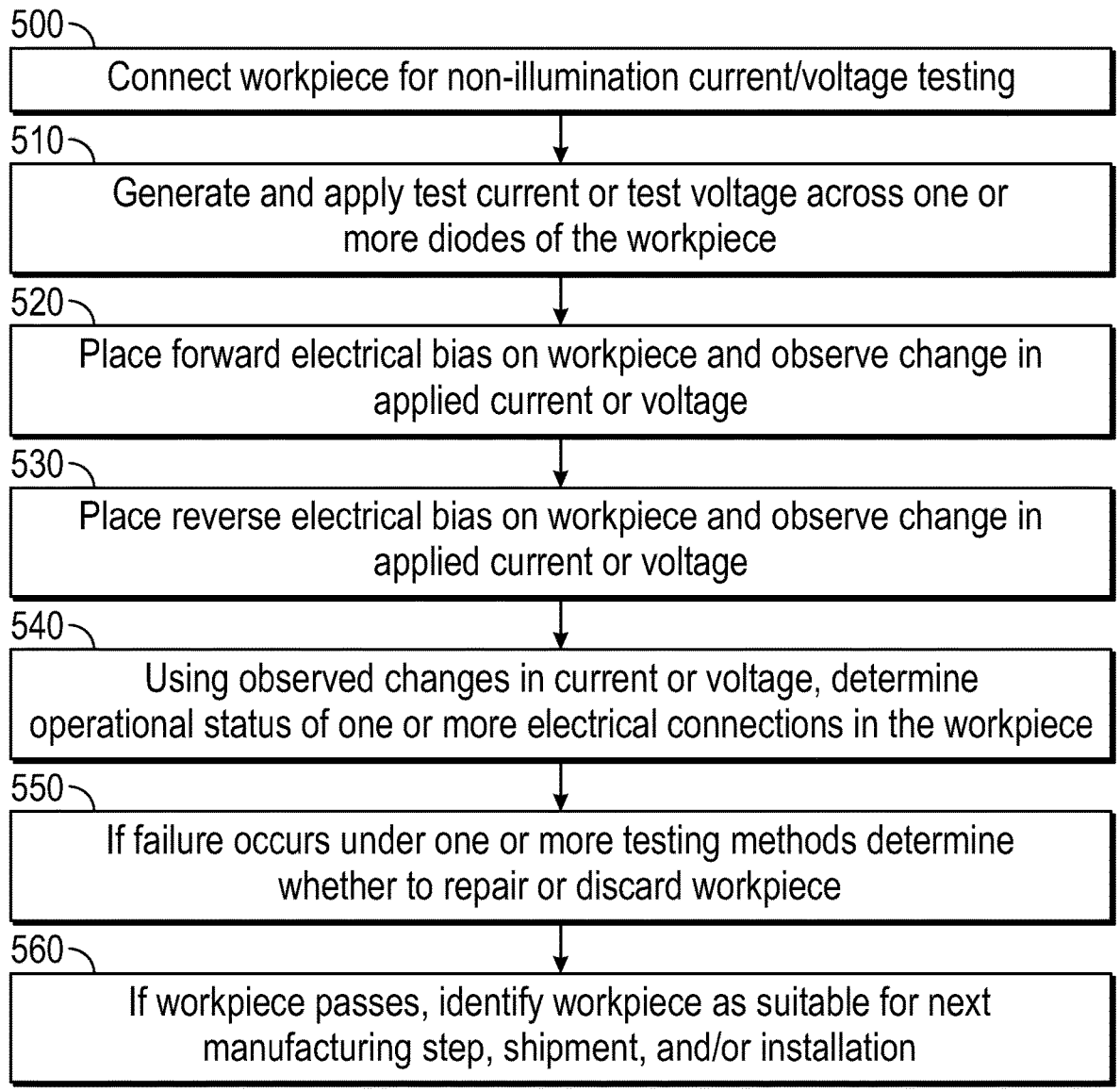
FIG. 5 illustrates process elements for non-illumination current/voltage (dark IV) workpiece testing as may be employed in some embodiments.

FIG. 5 illustrates process elements for non-illumination current/voltage (dark IV) workpiece testing as may be employed in some embodiments. As shown at 500 a workpiece may be connected for non-illumination current/voltage testing. Once connected, test current or test voltage may be applied across one or more diodes of the workpiece, as shown at 510. As shown at 520, a forward electrical bias may be placed on the workpiece followed by observation of any changes in applied current or voltage. Similarly, but in reverse, as shown at 530, a reverse electrical bias may also be placed on the workpiece followed by observations of any changes in applied current or voltage during this type of loading. As shown at 540, observed changes in current or voltage, may be observed in order to determine operational status of one or more electrical connections in the workpiece. As shown at 550, if failure occurs under one or more testing methods a determination may be made as whether or not to repair or discard the workpiece. As shown at 560, if the workpiece passes, it may be identified as suitable for a next manufacturing step, shipment, and/or installation.

Figure 6:
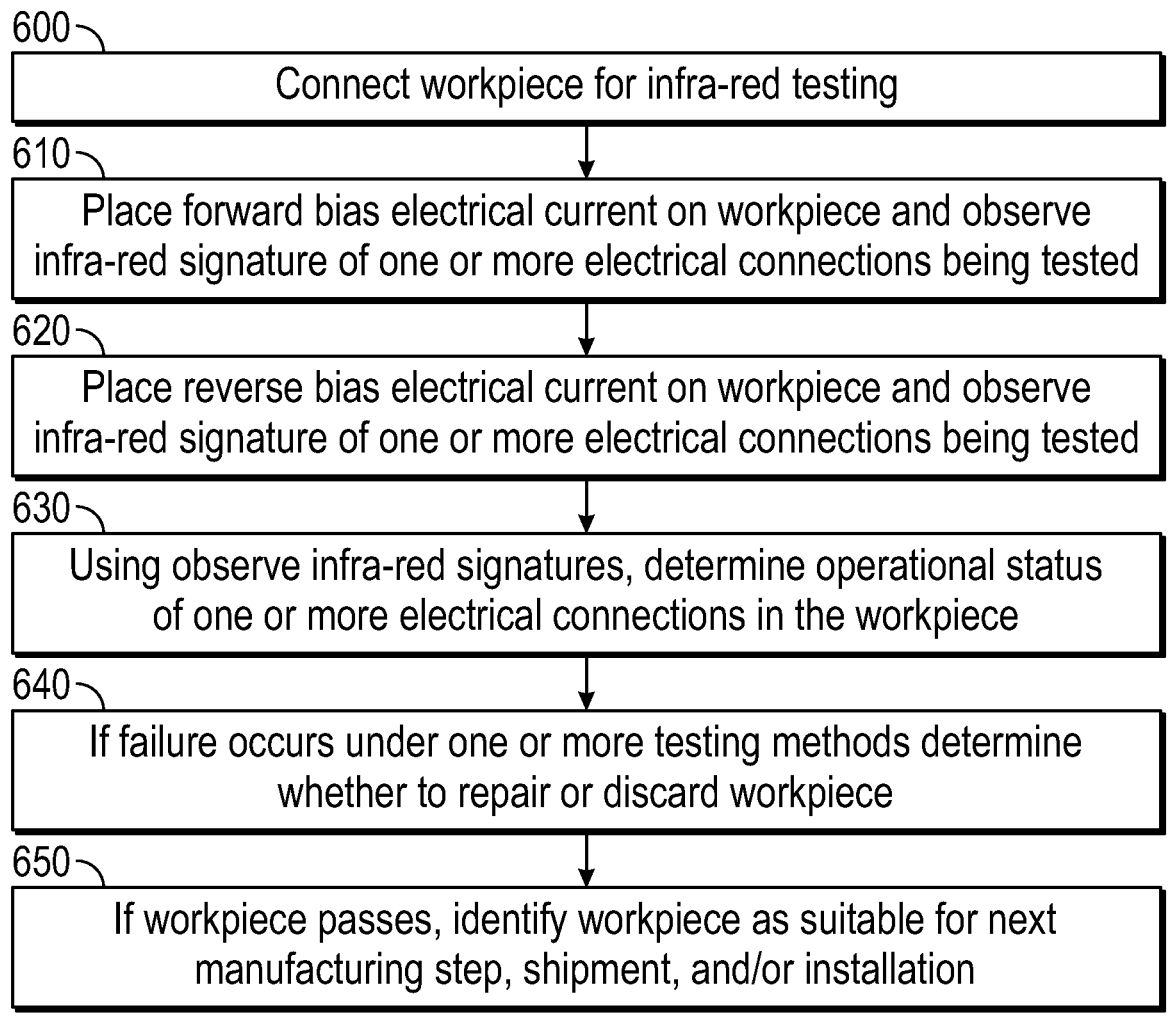
FIG. 6 illustrates process elements for infra-red workpiece testing as may be employed in some embodiments.

FIG. 6 illustrates process elements for infra-red workpiece testing as may be employed in some embodiments. As shown at 600, a workpiece may be connected for Infra-Red or other thermal spectrum testing. Once connected, as shown at 610, a forward bias electrical current may be placed on workpiece and infra-red or other thermal signatures may be observed of one or more electrical connections being tested. Also, at a different time, as shown at 620 a reverse bias electrical current may also be placed on the workpiece and infra-red or other thermal signatures may be observed of one or more electrical connections being tested. A testing system manager as well as a human operator may observe the infra-red signatures or other thermal signatures and use them to determine operational status of one or more electrical connections in the workpiece. These observations may include thermal observations, resistance measurements, inductance measurements, in both real-time as well as from stored data. These observations may be compared to known benchmarks to determine if a junction being tested meets or does not meet an expected performance standard. For example, an expected temperature rating or an expected resistance or an expected impedance. As shown at 640, if a failure occurs under one or more testing methods, a determination as to whether or not to repair or discard workpiece may be made. Comparatively, as shown at 650, if a workpiece passes, the workpiece may be identified as suitable for a next manufacturing step, shipment, and/or installation.

Figure 7:
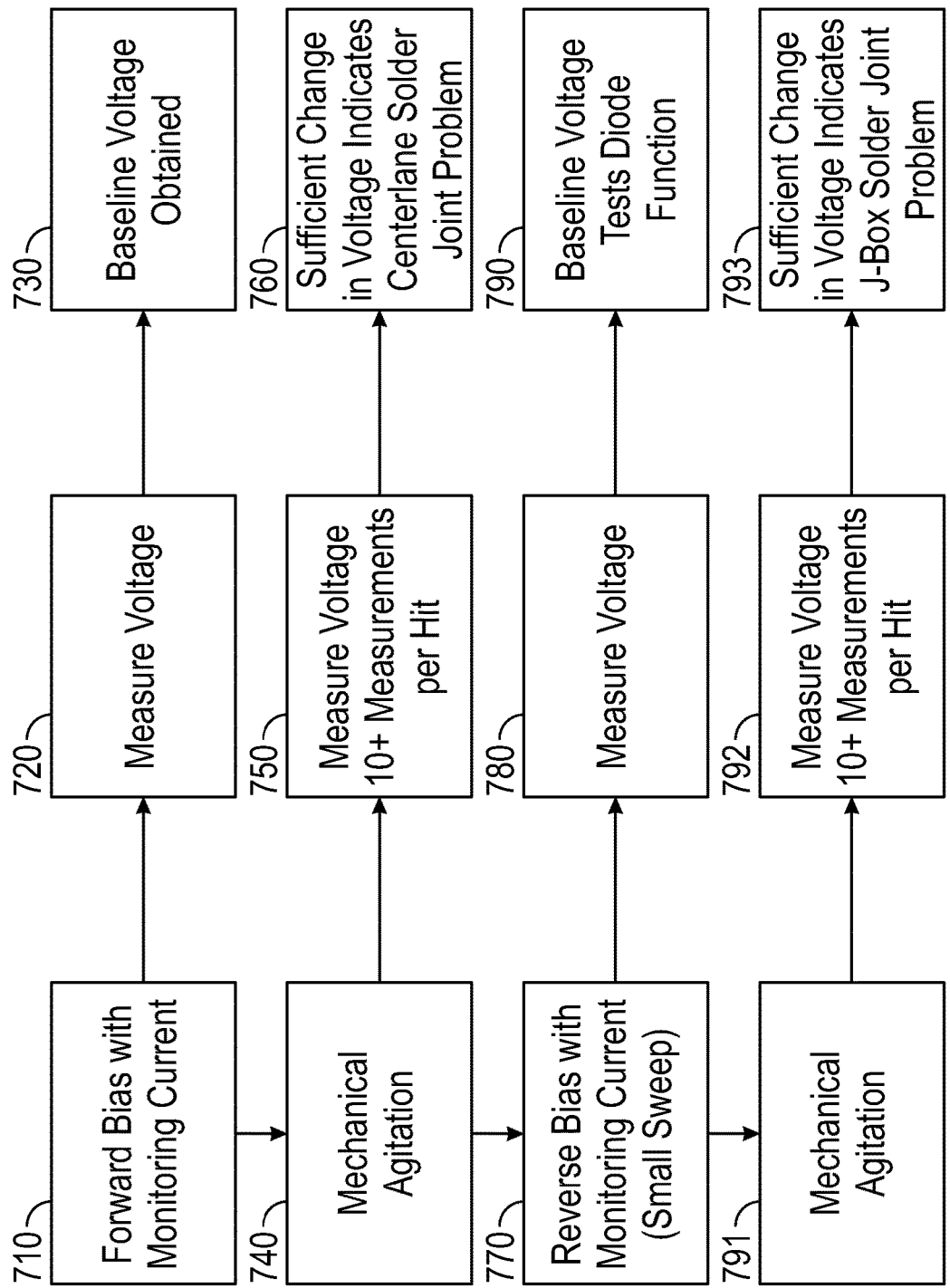
FIG. 7 illustrates process elements for mechanical agitation workpiece testing as may be employed in some embodiments.

FIG. 7 illustrates process elements for mechanical agitation workpiece testing as may be employed in some embodiments. This figure shows that embodiments can include applying a forward bias (710) measuring resulting voltage (720) and determining a baseline voltage (730). Afterwards, a testing methodology may be applied, here mechanical agitation (740), followed by testing at a sampling frequency at least 10× greater than the applied voltage frequency and changes in voltages are observed (760). A reverse bias may also be applied (770) followed by measurements (780) and a determination of baseline voltages (790). Being a reverse bias direction, the baseline voltages are reflective of diode function. Mechanical agitation (791) or other testing methodology from herein may follow the baseline determination.

Testing at a sampling frequency at least 10× greater than the applied voltage frequency and changes in voltages are observed (793).

Figure 8:
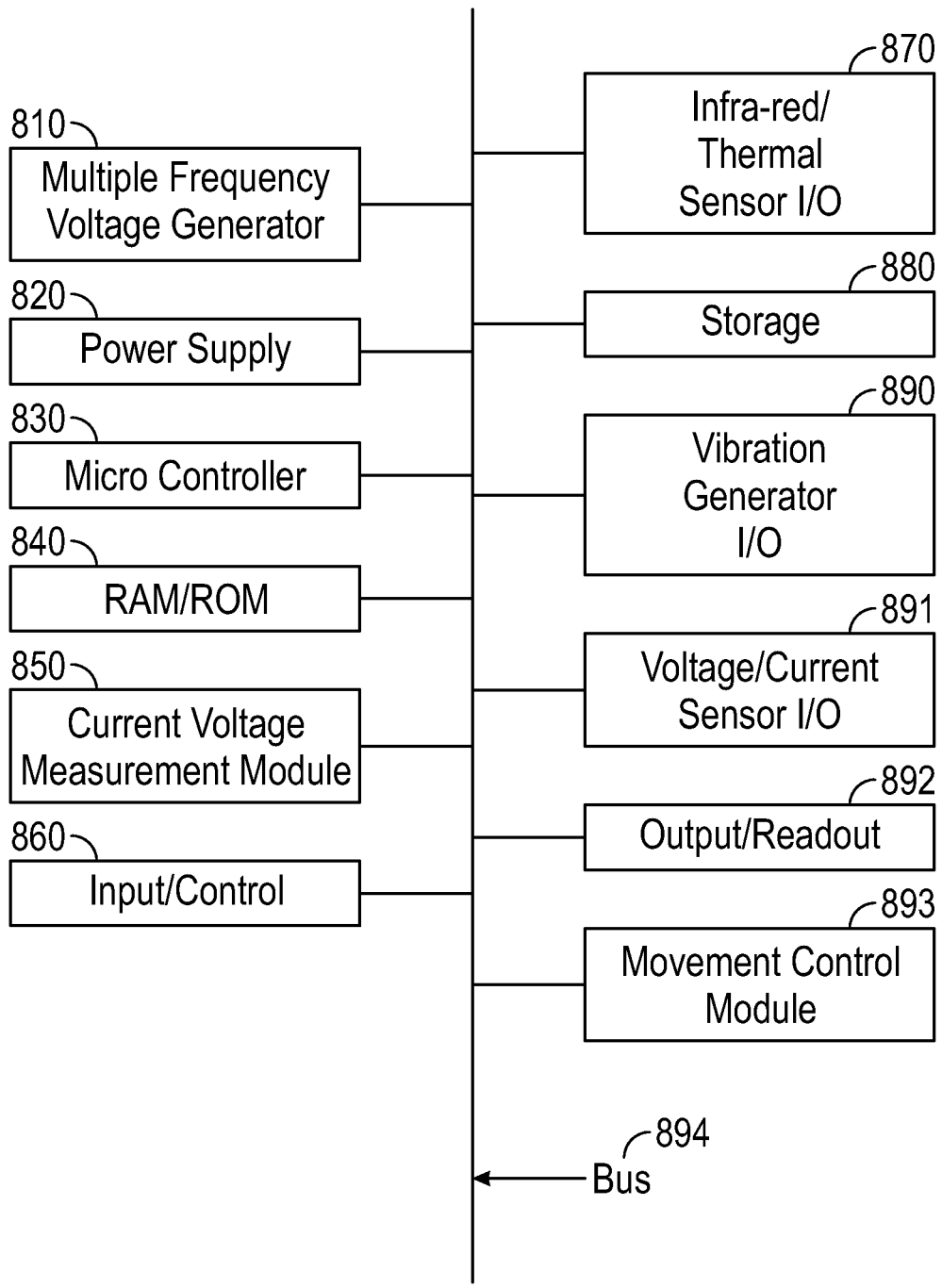
FIG. 8 illustrates an exemplary testing system manager according to some embodiments.

FIG. 8 illustrates an exemplary testing system manager 800 according to some embodiments. The testing system manager 800 may be employed in a single device or across multiple devices. The system manager 800 may include one or more connection buses 894 as well as multiple frequency voltage generator 810, power supply 820, microcontroller 830, RAM/ROM 840, voltage and current sensors input/output 891, voltage measurement modules 850, current measurement modules 850, output and readout components 892, input/output controls 860, thermal/infra-red sensors input/output 870, storage 880, vibration generator 890, and movement control module 893. The output and readout components may include optical displays, screens, and audio speakers. The storage 880 may store instructions for the microcontroller 830 to perform one or more of the actions described herein. These may include sending bias voltages and currents, reading sensor inputs, providing instructions to sensors, providing instructions for movement, providing outputs and the various other actions and processes and functions taught herein.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of testing an electrical pathway of a photovoltaic laminate comprising:
applying a monitoring voltage in a forward bias direction to a first photovoltaic laminate electrical diode connection between photovoltaic cells and measuring observed voltage at the first photovoltaic laminate electrical diode connection;
applying the monitoring voltage in a reverse bias direction to the first photovoltaic laminate electrical diode connection between the photovoltaic cells and measuring observed voltage at the first photovoltaic laminate electrical diode connection;
when applying a monitoring voltage in the forward bias direction, applying mechanical agitation to the first photovoltaic laminate electrical diode connection at a known frequency; and when applying a monitoring voltage in the reverse bias direction, applying mechanical agitation to the first photovoltaic laminate electrical diode connection at a known frequency; and
comparing measured observed voltage in the forward bias direction with applied voltage in the forward bias direction; and comparing measured observed voltage in the reverse bias direction with applied voltage in the reverse bias direction and, based on each comparison, determining if a diode failure is present at the first photovoltaic laminate electrical diode connection.

2. The method of claim 1 wherein the observed voltage when applying voltage in a forward direction is an alternating voltage.

3. The method of claim 1 wherein the observed voltage when applying voltage in a forward direction is a stable voltage.

4. The method of claim 1 further comprising:
when applying a monitoring voltage in the forward bias direction, applying mechanical agitation to the first photovoltaic laminate electrical diode connection at a first frequency; and when applying a monitoring voltage in the reverse bias direction, applying mechanical agitation to the first photovoltaic laminate electrical diode connection at a second frequency.

5. The method of claim 1 wherein the observed voltage when applying voltage in the forward direction is an alternating voltage alternating at a first frequency and wherein measuring the observed voltage at the first photovoltaic laminate electrical diode connection is conducted at a sampling frequency, the sampling frequency higher than the first frequency.

6. The method of claim 4 wherein observed voltage at the first photovoltaic laminate electrical diode connection when applying voltage in the forward bias direction and the reverse bias direction is sampled at a frequency larger than a frequency of the applied voltage in the forward direction and the reverse direction.

7. A method of testing an electrical pathway of a photovoltaic laminate comprising:
applying a monitoring voltage in a forward bias direction to a first photovoltaic laminate electrical diode connection between photovoltaic cells at a first frequency and sampling observed voltage at a second frequency at the first photovoltaic laminate electrical diode, the second frequency higher than the first frequency;
applying the monitoring voltage in a reverse bias direction to the first photovoltaic laminate electrical diode connection between the photovoltaic cells at a third frequency and sampling observed voltage at a fourth frequency at the first photovoltaic laminate electrical diode, the fourth frequency higher than the third frequency;
agitating the first photovoltaic laminate diode connection at an alternating frequency while applying the monitoring voltage in the forward bias direction at the first frequency; and
comparing sampled observed voltage in the forward bias direction with applied voltage in the forward bias direction; and comparing sampled observed voltage in the reverse bias direction with applied voltage in the reverse bias direction and, based on each comparison, determining if a diode failure is present at the first photovoltaic laminate electrical diode.

8. The method of claim 7 wherein the first frequency and the third frequency are the same and the second frequency and the fourth frequency are the same.

9. The method of claim 7 further comprising:

agitating the first photovoltaic laminate diode connection at an alternating frequency while applying the monitoring voltage in the reverse bias direction at the first frequency.

10. The method of claim 7 wherein the first photovoltaic laminate electrical diode connection between photovoltaic cells is in a potted junction box.

11. The method of claim 7 wherein the first photovoltaic laminate electrical diode failure is an intermittent electrical pathway.

12. The method of claim 9 wherein the agitating alternating frequency is less than the first frequency.

13. An electrical pathway intermittent fault detection device comprising:
   an electrical sensor; and
   a microcontroller,
      wherein the microcontroller is configured to apply a forward bias current through an electrical connection of a photovoltaic workpiece for a first period of time and to apply a reverse bias current through the electrical connection of the photovoltaic workpiece for a second period of time, and
      wherein the microcontroller is further configured to consider a frequency of vibration of a mechanical vibration generator applied to the photovoltaic workpiece by the mechanical vibration generator, and further configured to consider voltages sampled from the photovoltaic workpiece, the sampling conducted when the mechanical vibration generator is in contact with the photovoltaic workpiece, the sampling rate of considered voltages being faster than the frequency of vibration of the mechanical vibration generator.

14. The device of claim 13 wherein the workpiece is a photovoltaic laminate and the electrical connection resides in a potted junction box.

15. The device of claim 13 wherein the electrical connection has a maximum current, and wherein the forward bias current and the reverse bias current do not exceed the maximum current.

16. The device of claim 13 wherein the first period of time and the second period of time do not overlap and are each no longer than ten seconds and wherein the mechanical vibration generator is positionable below the photovoltaic workpiece.

17. The device of claim 13 wherein the mechanical vibration generator is mounted on a moveable control arm.

18. The device of claim 13 wherein the microcontroller is electrically coupled to a bus, the bus being electrically coupled to a power supply, a current voltage measurement module, and a movement control module.

* * * * *